United States Patent
Williams et al.

(10) Patent No.: US 7,228,474 B2
(45) Date of Patent: Jun. 5, 2007

(54) SEMICONDUCTOR DEVICE AND METHOD AND APPARATUS FOR TESTING SUCH A DEVICE

(75) Inventors: Emrys Williams, Milton Keynes (GB); Kenneth Alan House, Arlington, MA (US); Joseph Raymond Siegel, Shrewsbury, MA (US)

(73) Assignee: Sun Microsystems, Inc., Santa Clara, CA (US)

( * ) Notice: Subject to any disclaimer, the term of this patent is extended or adjusted under 35 U.S.C. 154(b) by 468 days.

(21) Appl. No.: 10/337,665

(22) Filed: Jan. 7, 2003

(65) Prior Publication Data
US 2004/0133832 A1   Jul. 8, 2004

(51) Int. Cl.
 *G01R 31/28* (2006.01)
 *H04L 1/00* (2006.01)
(52) U.S. Cl. .............................. 714/726; 713/176
(58) Field of Classification Search ............... 714/724, 714/732, 726–729; 711/163, 164; 713/176, 713/187, 200; 380/252
See application file for complete search history.

(56) References Cited

U.S. PATENT DOCUMENTS

| 5,357,572 A * | 10/1994 | Bianco et al. ............... 713/193 |
| 5,583,786 A | 12/1996 | Needham |
| 6,745,359 B2 | 6/2004 | Nadeau-Dostie |
| 6,751,321 B1 * | 6/2004 | Kato et al. ................... 380/201 |
| 6,886,121 B2 * | 4/2005 | Dervisoglu et al. .......... 714/726 |
| 6,901,546 B2 | 5/2005 | Chu et al. |
| 2002/0076050 A1 * | 6/2002 | Chen et al. ................... 380/231 |
| 2004/0133831 A1 | 7/2004 | Williams et al. |
| 2004/0133836 A1 | 7/2004 | Williams |

FOREIGN PATENT DOCUMENTS

WO         01/25924         4/2001

OTHER PUBLICATIONS

Maunder et al., "Testability on TAP", IEEE Spectrum, Feb. 1992, pp. 34-37.*
*Fault Diagnosis of Digital Circuits*, Yarmolik, Minsk Radio Engineering Institute, USSR, John Wiley & Sons Ltd., Chichester, England, 1990, pp. 30-34, 73-93, 114-121, 136-138, and 154-157.
Anshuman Chandra, "System-on-a-Chip Test-Data Compression and Decompression Architectures Based on Golomb Codes," IEEE, 2001, pp. 355-368.

* cited by examiner

*Primary Examiner*—Albert Decady
*Assistant Examiner*—John J. Tabone, Jr.
(74) *Attorney, Agent, or Firm*—Robert C. Kowert; Meyertons, Hood, Kivlin, Kowert & Goetzel, P. c.

(57) ABSTRACT

A semiconductor device includes at least one component which is vulnerable to damage during scan testing for a particular input data configuration, and supports a safe mode in which this particular input data configuration is disabled. The semiconductor device also includes a port for receiving an input scan vector for scan testing, and an authorization unit connected to said port. The authorization unit maintains the device in safe mode if an input scan vector does not satisfy at least one predetermined criterion. In one particular implementation, the authorization unit generates a digital signature for the input scan vector, which is then compared to a signature portion included within the input scan vector itself. Scan testing is enabled providing that this comparison finds a match.

33 Claims, 14 Drawing Sheets

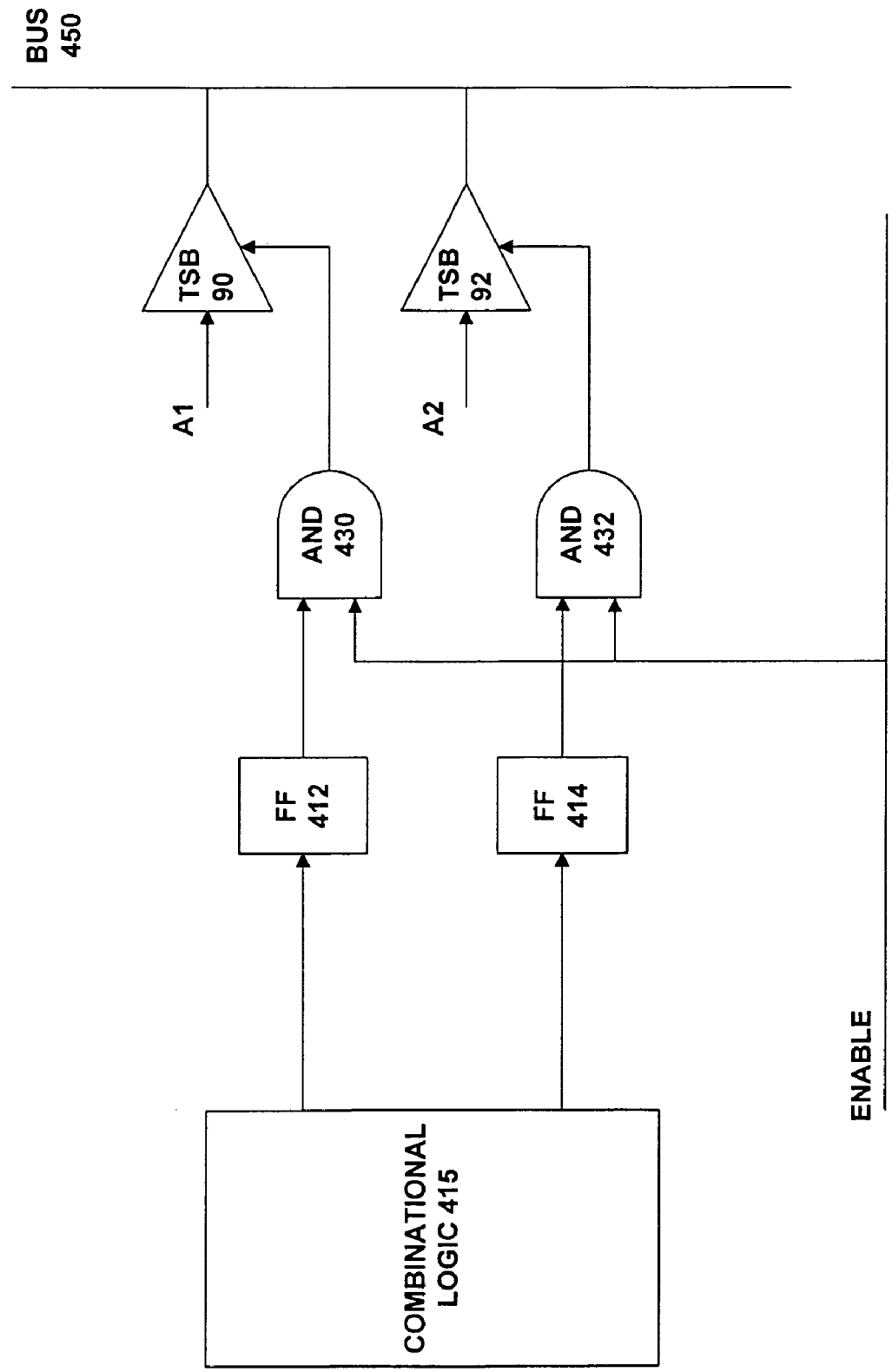

SEMICONDUCTOR DEVICE AND METHOD AND APPARATUS FOR TESTING SUCH A DEVICE

RELATED APPLICATION

The present application is related to the U.S. patent application Ser. No. 10/337,573 (assignee reference number P6588), filed concurrently herewith, and sharing the same title, inventors, and assignee as the present application, the teachings of which are incorporated by reference herein.

FIELD OF THE INVENTION

The present invention relates to semiconductor devices, and in particular to the testing of such devices.

BACKGROUND OF THE INVENTION

Modern computer systems typically involve many components interacting with one another in a highly complex fashion. For example, a server installation may have multiple processors, configured either within individual (uniprocessor) machines, or combined into one or more multiprocessor machines. Such computer systems operate in conjunction with associated memory and disk drives for storage, video terminals and keyboards for input/output, plus interface facilities for data communications over one or more networks. The skilled person will appreciate that many additional components may also be present.

The pervasive use of such computer systems in modern day society places stringent requirements on their reliability. For example, it is especially important that the storage, manipulation and transmission of commercially significant information can all be performed correctly, without the introduction of errors. It is therefore of great importance that computer systems are correctly designed and built, and also that they continue to perform properly during their operational lifetime.

This in turn generates the need to be able to reliably test computer systems, especially during initial system design and construction. In addition it is also highly desirable to be able to test machines or components of machines in situ at customer premises, in a production environment. For example, the situation may arise where a processing error is suspected or detected in a customer system, but the source of the error is obscure. Since a typical server installation may be formed from multiple hardware and software components (each of which may potentially be supplied by a different vendor), tracing the error to its original source can be a difficult task. In such circumstances, the ability to show that at least certain components are properly functional can help to isolate the location of the fault. Indeed, even in situations where there is no particular evidence that a fault is present, it can still be desirable to be able to positively demonstrate at a customer location that a particular component (such as a newly installed device) is working properly.

One standard way of checking that hardware components are operating properly is by performing a functional test. In order to achieve this, a particular hardware unit is given some input data to process. It is then confirmed that the output from the unit represents the expected result for the given input data.

Unfortunately, the complexity of modern systems means that such functional testing can suffer from certain limitations. Thus the employment of multiprocessing cores within a single CPU, along with techniques such as register renaming, asynchronous IO, and out-of-order execution, make it difficult to determine in advance the exact processing sequence within a given hardware device. For example, microscopic timing variations from one program run to another may impact the precise execution strategy, such as which operations are performed in which particular processing core, and using which particular registers. (Of course, this will normally be transparent to programs running on the system).

As a result, it is difficult to be completely confident that all components in the system have been properly exercised when performing a functional test. For example, imagine that a particular register is potentially faulty, but that only some executions of a functional test program will actually utilise this register. In this situation, it is difficult to be certain that a positive result for a functional test is due to the fact that the register is indeed properly operational, rather than the register in question simply not being used for that particular execution.

One known alternative (or complement) to functional testing is scan testing, which can help address the above problem. Scan testing is typically applied to semiconductor devices, and is described, for example, in "Fault Diagnosis of Digital Circuits" by V Yarmolik, Wiley, 1990 (ISBN 0 471 92680 9).

FIG. 1 illustrates in simplified schematic form one stage of a generalised semiconductor processing device, in which combinational logic 15 is interposed between flip-flop 12 and flip-flop 14 (the flip-flops may also be replaced by registers and such like). At each clock signal (CLK), the contents of flip-flop 12 are output to combinational logic 15, and the contents of flip-flop 14 are output to the next stage (indicated by arrow C in FIG. 1). Flip-flop 12 then receives new contents from a preceding stage in the device (indicated by arrow A in FIG. 1), while the output of combinational logic 15 is loaded into flip-flop 14.

A complicated semiconductor device can then be regarded as formed from a large number of stages such as shown in FIG. 1. (Note that each stage comprises combinational logic plus a single flip-flop, so that, strictly speaking, FIG. 1 depicts one and a half stages, with flip-flop 12 and logic 15 forming a first stage, and flip-flop 14 then representing the input side of the next stage).

The various stages in a semiconductor device can be connected together in a highly complex manner (rather than just simply having a linear chain of one stage after another). For example, as shown in FIG. 1, combinational logic 15 may receive input for processing from more than one preceding stage (indicated schematically in FIG. 1 by arrows A and B). Similarly, the output from one stage may be split and directed to multiple other stages, including feedback loops and so on.

FIG. 2 illustrates a modification to the circuit of FIG. 1 in order to support scan testing. The components from FIG. 1 are supplemented in FIG. 2 by the addition of two multiplexers, MX 18 and MX 20, which are located in front of flip-flop 12 and flip-flop 14 respectively. Each multiplexer has two inputs, with the selection of the output from the multiplexers being controlled by a SCAN signal.

Considering the operation of multiplexer 20, when the SCAN signal is not set (i.e., has a value 0), then multiplexer 20 outputs to flip-flop 14 the signal that it receives from combinational logic 15. Thus in this mode, the presence of multiplexer 20 is, in effect, transparent, and the circuit operates in the same manner as described in relation to FIG. 1. However, when the SCAN signal is asserted (i.e., has a value 1), multiplexer 20 now outputs its second input, which is received from bypass line 25, which in turn is linked to the output of flip-flop 12. The consequence of this is that in scan mode (i.e., with the SCAN signal asserted), for each clock signal the contents of flip-flop 12 are simply shifted to flip-flop 14, as if combinational logic 15 were not present.

Multiplexer 18 operates in analogous fashion to multiplexer 20. Thus in normal mode, without the SCAN signal being asserted, its output corresponds to input A. However, in scan mode, its output now corresponds to input A', which represents a direct connection to the output of a preceding flip-flop (not shown in FIG. 2), similar to bypass line 25.

To support full scan testing of a semiconductor device, the configuration of FIG. 2 is repeated for all relevant stages in the device. Thus a sequence of flip-flops is defined, with each flip-flop being preceded by a multiplexer. A first input to each of the multiplexers represents the normal operational input to the flip-flop, while the second input is connected by a bypass line to the preceding flip-flop in the sequence. In scan mode therefore, when the second input to the multiplexer is enforced, the sequence of flip-flops from all the different stages operates in effect as a long shift register, in which the contents of a flip-flop progress to the next flip-flop in the sequence at every clock signal.

The support of scan mode provides a mechanism both to read data into the flip-flops of a semiconductor device, and also to read data out of the flip-flops. One use of this is to verify that the device properly processes a predefined input sequence. The granularity of this testing can be as fine as one processing operation (i.e. one clock cycle).

This is illustrated schematically in FIGS. 3A–D, which each depict a sequence of flip-flops F1, F2, F3, and F4 respectively interlinked by combinational logic CL1, CL2, and CL3. Arrows A and C represent an external input and output facility respectively for the scan sequence, for example through appropriate pins on the semiconductor device. In FIG. 3A there is a binary data sequence of 110 to be input to the device (this is referred to as the input scan vector). Keeping the system in scan mode, after the first clock cycle, the 0 value is read into F1. After the second clock cycle, the 0 value is shifted into F2, while the 1 is read into F1. Next, after the third clock cycle, the 0 and 1 are shifted from F2 to F3 and from F1 to F2 respectively, while the last 1 of the input is read into F1. This leads to the position shown in FIG. 3B, in which the device has now been primed in effect to a predetermined starting state, as specified by the input scan vector.

We now suspend scan mode for a single processing cycle, which leads to the situation in FIG. 3C. This processing operation results in new data values being stored in F2, F3, and F4. The values stored are dependent on the input scan vector and the particular format of logic CL1, CL2, and CL3, and in FIG. 3C are assumed (for illustration) to be 1, 0, and 1. Re-asserting scan mode then allows the data values generated as a result of this processing to be read out in three clock cycles, as per FIG. 3D, to form an output scan vector.

It will be appreciated that analysis of the output scan vector for a given input scan vector provides a very powerful diagnostic tool for confirming that the various parts of a semiconductor device are properly operational. Consequently, scan testing is frequently employed in semiconductor fabrication plants, typically as part of the assembly line process.

Note that although in both FIG. 2 and FIGS. 3A–D, the sequence in which the flip-flops are connected up for scan testing corresponds to the normal operational flow of data through the flip-flops, this will not generally be the case. Indeed, this would actually be impossible for most devices, since as mentioned above, the normal data flow typically includes branches and such like, and so cannot be represented by a single chain or sequence of flip-flops.

As an example of this, although FIG. 2 shows bypass line 25 linking flip-flop 12 to flip-flop 14 in the same direction as data flow for standard processing, it would also be possible for the scan sequence to go in the opposite direction, i.e. a bypass line to go from the output of flip-flop 14 into multiplexer 18. In this case the bypass output of flip-flop 12 would go to some other multiplexer (not multiplexer 20), and likewise the bypass input of multiplexer 20 would come from some other flip-flop (not flip-flop 12).

In devices containing a large number of flip-flops, the bypass lines linking up the flip-flops into a single sequence for scan mode sometimes have to follow rather lengthy and indirect paths. This is primarily because priority in terms of layout is given to optimising the standard data flow of the device (i.e. through the combinational logic). Consequently, the clock rate for scan mode is usually significantly less than the normal clock rate of the device, to avoid any possible problems with signal timing on the relatively long bypass connections. Typically this reduced clock rate is achieved by providing a reduced (scan) rate clock signal to the clock line (CLK in FIG. 2).

As stated above, one of the advantages of scan testing is that it allows the flip-flops of the semiconductor device to be loaded with an arbitrary set of input data. Unfortunately however, this power and flexibility can also represent something of a hazard. An example of where such a problem can arise is illustrated in FIG. 4. (Note that for simplicity, the clock lines and scan mode circuitry have been omitted from FIG. 4).

As shown in FIG. 4, combinational logic 415 drives two flip-flops 412 and 414, each of which is respectively connected in turn to an AND gate 430, 432, and from there as the control input to a tri-state buffer (TSB 90 and 92). The outputs of the two tri-state buffers 90 and 92 are then connected to bus 450.

A tri-state buffer (or driver), as its name suggests, has three possible outputs. If the control input is 1, then the buffer is in an ON state, and simply outputs 0 or 1, mirroring its data input (shown schematically in FIG. 4 as A1 and A2 for TSB 90 and 92 respectively). However, if the control input is a 0, then the gate is in an OFF state and in effect disconnected from the circuit. Consequently, it can neither drive nor load another device.

Tri-state buffers are typically high output devices and can be used to drive a large number of gates. They are frequently employed in computer systems, for example for connecting registers to a common bus. However, the high power output can potentially cause problems. For example, in the circuit of FIG. 4, having both TSB 90 and TSB 92 simultaneously in an ON state may lead to excess current on bus 450, and potentially damage either the bus or devices attached to the bus. To avoid this, the combinational logic 415 of FIG. 4 can be designed to ensure that only one of the two TSBs 90 and 92 is ever in an ON state at any given time. As a further safeguard, an ENABLE signal is supplied to AND gates 430 and 432. When the ENABLE signal is absent, the outputs of the two AND gates are both held low, and so the two TSBs are both kept in a safe (OFF) state.

Considering now the application of a scan test to the circuitry of FIG. 4, the device can be maintained in safe mode, with the ENABLE signal absent, while initially loading the scan vector (corresponding to the transition from FIGS. 3A to 3B). The same also applies during the read out of the output scan vector (corresponding to the transition from FIG. 3C to FIG. 3D). However, the device must be taken out of safe mode, and the ENABLE signal asserted, in order to allow one or more normal processing steps to occur (corresponding to the transition from FIG. 3B to FIG. 3C). Otherwise, it is simply not possible to properly test the operation of the device.

Unfortunately, there is a danger that a particular scan vector may load 1 into both flip-flop 412 and also into flip-flop 414, since the combinational logic 415 that would normally ensure that this cannot happen is being bypassed in a scan test. This in turn may damage the chip, typically through causing excess current flow and the resultant overheating.

In a normal semiconductor fabrication facility it is relatively easy to ensure that the above problem does not arise, since the input scan vector applied on a given line for a given chip can be carefully controlled. However, as explained above, it is sometimes desirable for a field engineer or service operative to be able to perform testing at a customer location. This may include the use of scan testing via some portable electronic equipment to supply the input scan vector, and then to read and analyse the output scan vector.

In such circumstances, the risk of an inappropriate scan vector being used for testing a device is much higher. Thus one danger is that the scan vector becomes corrupted while being stored on the portable electronic equipment, or while transmitted to or from such equipment. A further possibility is that a typical engineer may have to deal with many different components in the field, including different versions or refinements of the same underlying product. Each such component may potentially have its own input scan vector or vectors stored on the portable electronic equipment, and there may be confusion about which particular one to use in a given situation.

If this leads to the wrong input scan vector being used to test a particular component (or possibly the right input scan vector being applied to the wrong component), then as mentioned above, this may result in damage to the device being tested. If such damage is readily noticeable, then the component concerned can be removed or disconnected, although the engineer may well not have a replacement part immediately to hand. A more insidious possibility is that the component suffers less apparent damage, which may cause problems with (intermittent) errors or degraded reliability in the future. In any event, the supplier or service organisation is likely to suffer poor customer satisfaction, and increased expense.

In addition to the risk of accidental damage, there is also a danger that someone may deliberately try to disable or at least degrade a device. One way of attempting such a malicious attack is potentially by inputting an inappropriate scan vector.

SUMMARY OF THE INVENTION

Accordingly, a semiconductor device is provided in accordance with one embodiment of the invention that includes a port for receiving an input scan vector for scan testing, and an authorisation unit connected to the port. The authorisation unit maintains the device in a safe mode if an input scan vector does not satisfy at least one predetermined criterion, wherein scan testing with the input scan vector is at least partially disabled.

As previously described, the semiconductor device may include a component that is vulnerable to potential damage during scan testing with a given input data configuration. In safe mode, the semiconductor device is generally protected against any potentially dangerous input data configuration by preventing the input scan vector from becoming operational (rather it just ends up being shifted through the device). This safe mode is therefore exploited to help reduce or eliminate the risk of an incorrect input scan vector damaging the device, by now verifying within the device itself that the input scan vector is correct.

Thus if the input scan vector does not satisfy the predetermined criterion (or criteria), it is regarded as not properly authorised. This may occur for example because the wrong input scan vector is being used, or because what was originally the correct input scan vector has somehow become corrupted. If the input scan vector is not properly authorised, the device is maintained in safe mode, which prevents any damage being done to the device through the use of an inappropriate scan vector.

It will be appreciated that the use of an incorrect scan vector may be either accidental or malicious, the latter representing a deliberate attempt to damage the device. In addition, an attempt may be made to reverse engineer a semiconductor device by supplying a wide range of input scan vectors, and analysing the various results. Again, the authorisation process described herein can protect against such an attack, by rejecting unauthorised input scan vectors.

Note that incorporating the authentication unit into the device itself is more secure and robust than relying on some external verification mechanism (whether human or machine), since it is directly tied to the hardware under test. It also provides protection against any corruption of the input scan vector as it is being loaded into the device.

In one particular embodiment, the device is maintained in safe mode by not supplying an enable signal to a component that is vulnerable to potential damage during scan testing. Consequently, the component does not give effect to the input scan vector, and so is protected against the potential damage. Of course, it would also be possible to supply instead a specific disable signal, should the input scan vector turn out not to be properly authorised, and further options will be apparent to the skilled person.

A variety of strategies can be used to underlie the authorisation process. In one particular embodiment, the authorisation unit maintains the device in safe mode if an input scan vector does not incorporate an input authorisation code that matches a predetermined authorisation code. This predetermined authorisation code can be stored within the authorisation unit itself, for example in a ROM, and may conveniently be something like the mask id used to originally fabricate the chip. The authorisation unit then compares the input authorisation code against the predetermined authorisation code. If there is a match, then the input scan vector is regarded as duly authorised, and so can be used for scan testing the chip. (Note that the authorisation code is normally removed from the input scan vector prior to the scan testing itself, i.e. it is not part of the vector supplied to the actual sequence of flip-flops).

In a slightly different approach, the input scan vector includes an appended digital signature portion. This can then be used as the basis for assessing whether or not the input scan vector should be authorised. In one particular embodiment, the authorisation unit includes a signature generator that calculates an input signature value from the input scan vector. The signature generator can be implemented by a cryptographic digital signature generator, a hashing unit, a linear feedback shift register, or any other appropriate device. The authorisation unit then maintains the device in safe mode if the signature value for the input scan vector, as determined by the signature generator, does not match the signature portion of the input scan vector.

A particular advantage of the digital signature approach is that the signature is calculated from the (operative) input scan vector itself. Thus the signature serves as a direct confirmation that the correct input scan vector is being used, since any change or corruption of the input scan vector will lead to a different (incorrect) digital signature being calculated, and hence a lack of authorisation.

Security can be further enhanced by storing a public key on the device. This public key corresponds to a private key of an asymmetric encryption algorithm used to initially generate (encrypt) the signature portion of the input scan vector. The signature portion can then be decrypted using this public key, and compared with the calculated input signature value. A match will then only be found providing: (i) the input scan vector originates from the duly authorised source, in other words, the owner of the private key, typically the device manufacturer; and (ii) it has not been corrupted or tampered with since creation. It will be appreciated that this therefore provides a very high degree of reassurance that a legitimate input scan vector is indeed being used.

As an additional precaution, the mask identifier for the intended test device can be included in the input scan vector. This can then be checked against a mask identifier stored on the device to be tested, in order to confirm that the input scan vector and the test device have been properly matched. Note that the mask vector can be included in the initial calculation for the signature portion, and so is protected against any subsequent modification, since the signature portion is now dependent on the value of the mask identifier.

Similarly, in some embodiments, a device identifier for the intended test device can be included in the input scan vector. This can then be checked against a device identifier stored on the device to be tested. Again the purpose here is to confirm that the input scan vector and the particular test device have been properly matched. It will be appreciated that this degree of customisation, in which an input scan vector is specialised to a single device, increases the complexity of managing the service operation, and so may only be appropriate in high security situations (e.g. banking, military, and so on).

As described above, the normal result of a scan test is an output scan vector. In one embodiment, this is modified to incorporate a bit which is used to indicate whether or not the corresponding input scan vector was properly authorised. This in turn allows a proper interpretation of the scan results, since they will vary according to whether or not the device was maintained in safe mode during the test. (It will be appreciated that in another embodiment, a byte or any other suitable form of flag may be included in the output scan vector, instead of the indicator bit, in order to record whether or not the input scan vector was properly authorised).

In one embodiment, the device also includes a pin which can be used to allow the device to go out of safe mode irrespective of whether or not the input scan vector satisfies at least one predetermined criterion. Typically the system is automatically allowed out of safe mode if the pin is asserted. Alternatively, the pin may be used to set a register bit, which then has the same effect.

Such a pin facility is useful at fabrication time, where the input scan vectors used are normally sufficiently reliable to remove the need for specific authorisation (which would then only represent additional overhead). This pin however is located in a position that becomes inaccessible after the device is mounted on a board or other carrier. Consequently, only properly authorised input scan vectors can then be used for testing in a system or field environment.

In accordance with another embodiment of the invention, there is provided a system which is amenable to testing by an input scan vector. The system incorporates an authorisation unit for determining whether or not an input scan vector satisfies at least one predetermined criterion. This allows scan testing with the input scan vector to be at least partially disabled if the predetermined criterion is not satisfied.

In accordance with another embodiment of the invention, there is provided a semiconductor scan test unit. The test unit includes a port for establishing an electrical connection with a semiconductor device under test. The test unit further includes a stored input scan vector for supply to the semiconductor device under test via the electrical connection. The input scan vector comprises first and second portions (which may be in any order). The first portion is operable to set the semiconductor device to a predetermined logical state, as per conventional scan testing, while the second portion provides an authorisation to the semiconductor device. This allows the device to confirm that the first portion is legitimate (for example, intended for that particular device, and not corrupted), and hence not liable to damage the device at all. In one particular implementation, the second portion comprises a digital signature of the first portion.

In accordance with another embodiment of the invention there is provided a method of scan testing a semiconductor. The method comprises the steps of providing an input scan vector to the semiconductor device, and determining whether or not the input scan vector satisfies at least one predetermined criterion. If this is not the case, then the device is maintained in a safe mode, in which scan testing is at least partially disabled.

It will be appreciated that such a method can generally utilise the same particular features as described above in relation to the device and system embodiments.

BRIEF DESCRIPTION OF THE DRAWINGS

Various embodiments of the invention will now be described in detail by way of example only with reference to the following drawings in which like reference numerals pertain to like elements and in which:

FIG. 4 illustrates the use of tri-state buffers as an example of a circuit which requires particular input values to avoid potential failure;

DETAILED DESCRIPTION

Figure 1:
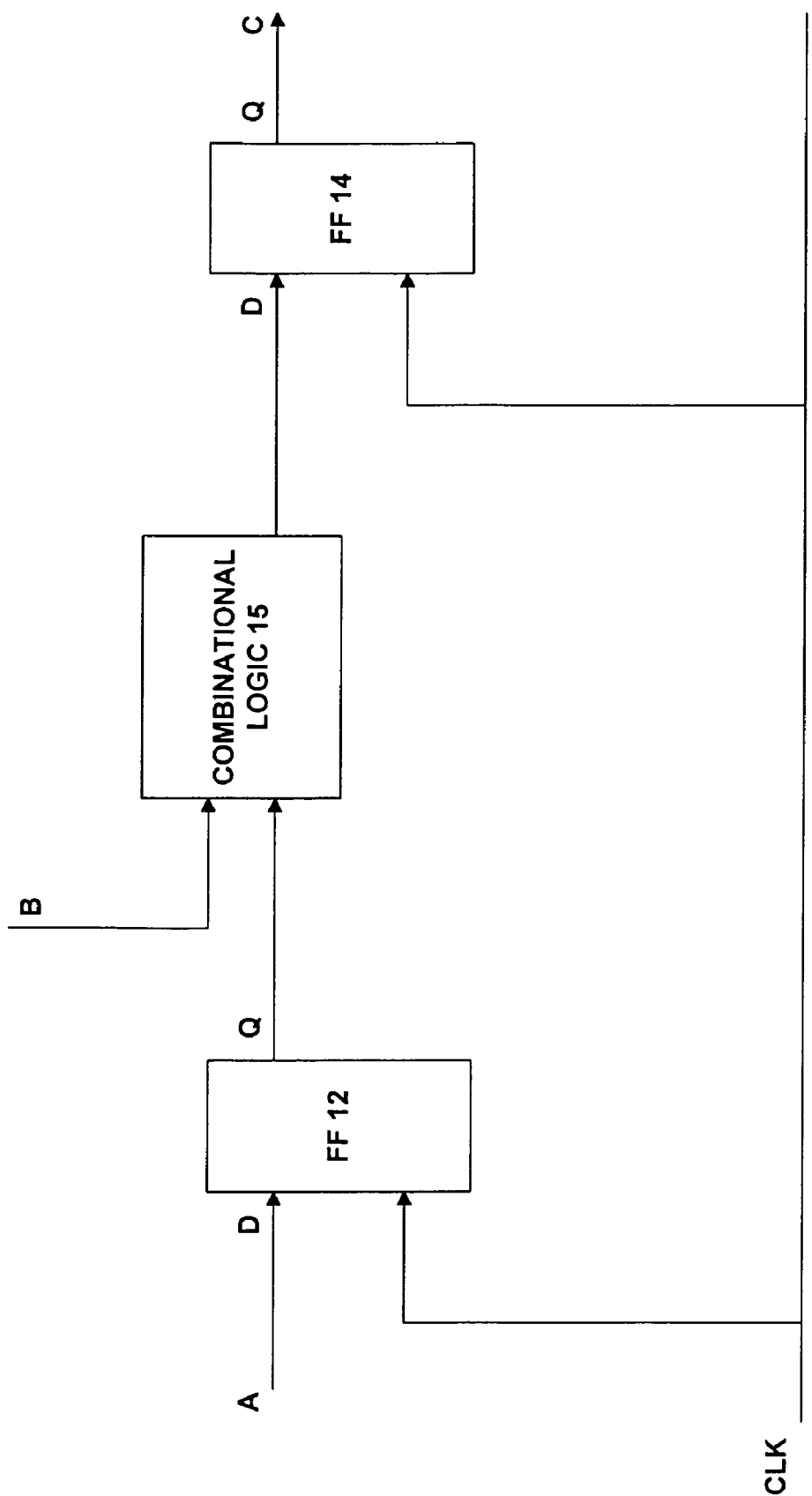
FIG. 1 is a schematic diagram illustrating a simplified generic stage in a semiconductor device.
Figure 2:
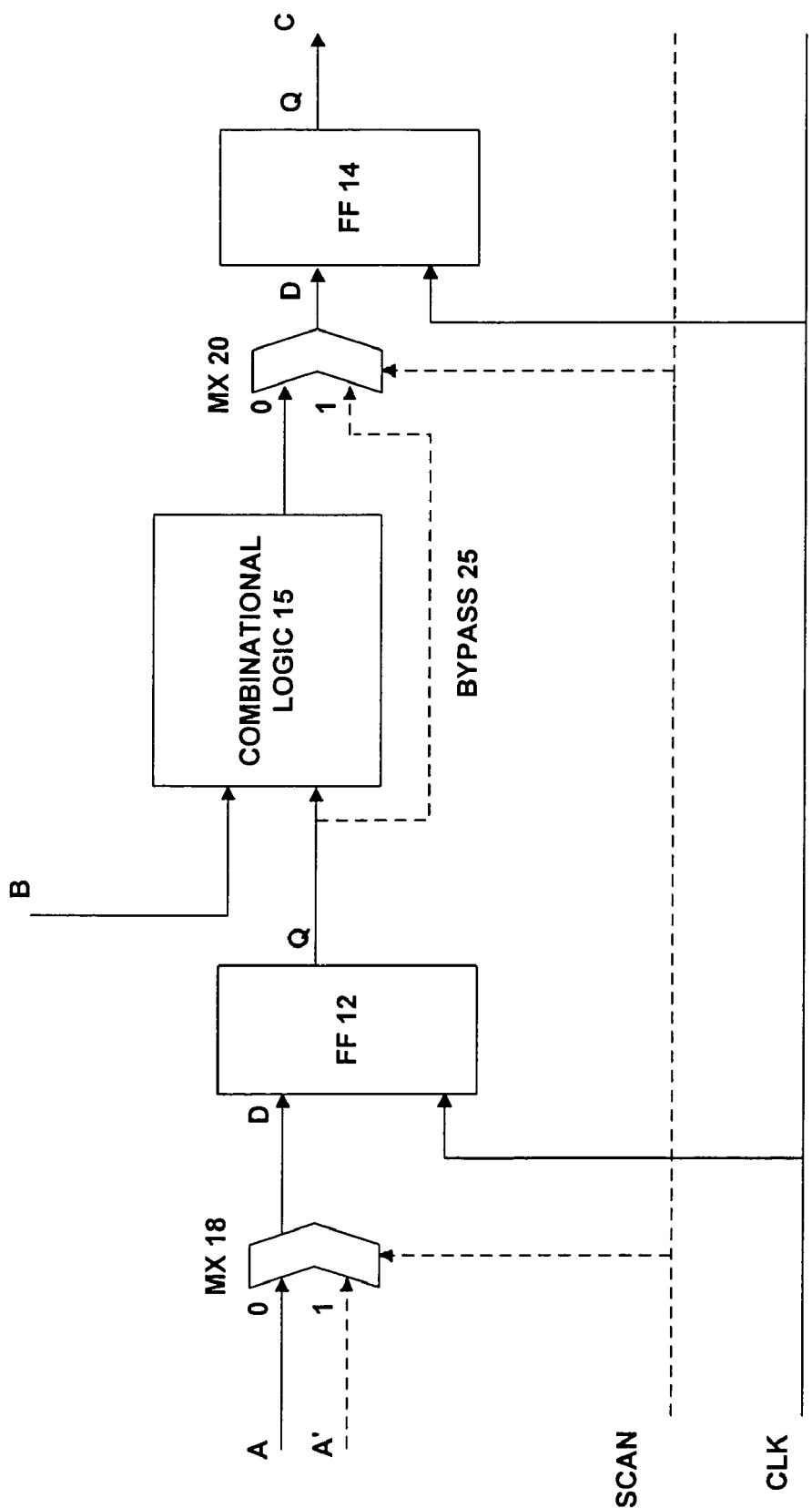
FIG. 2 illustrates the application of scan testing to the circuit of FIG. 1.
Figure 3A:
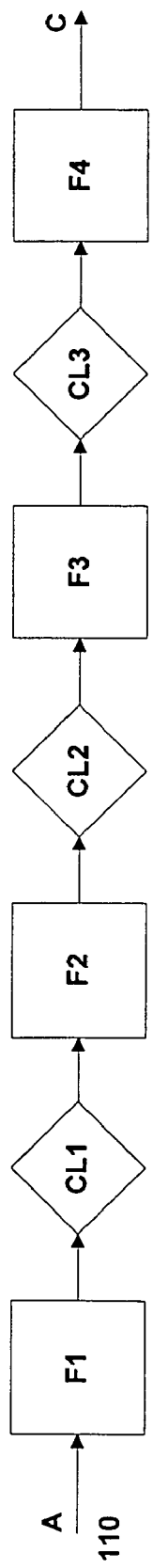
FIGS. 3A–3D illustrate the general operation of scan testing.
Figure 3B:
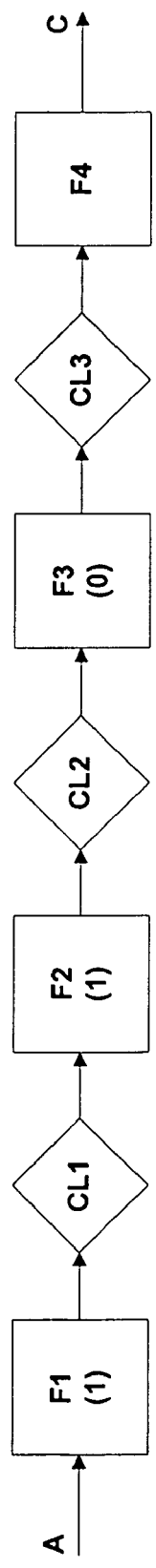
Figure 3C:
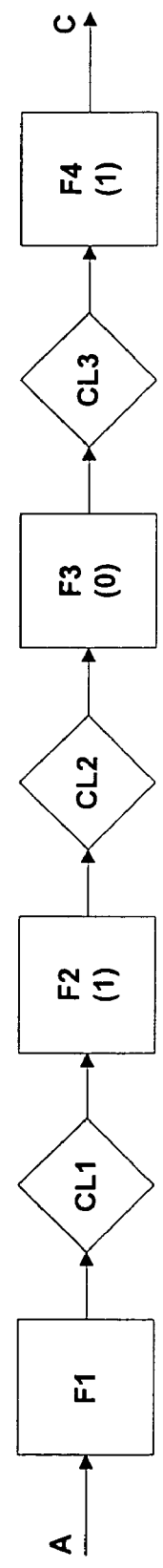
Figure 3D:
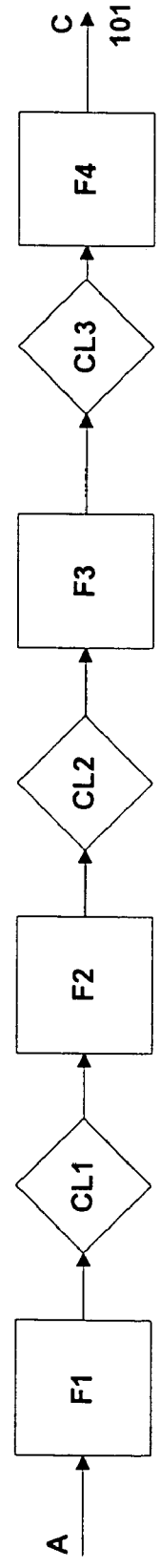
Figure 5:
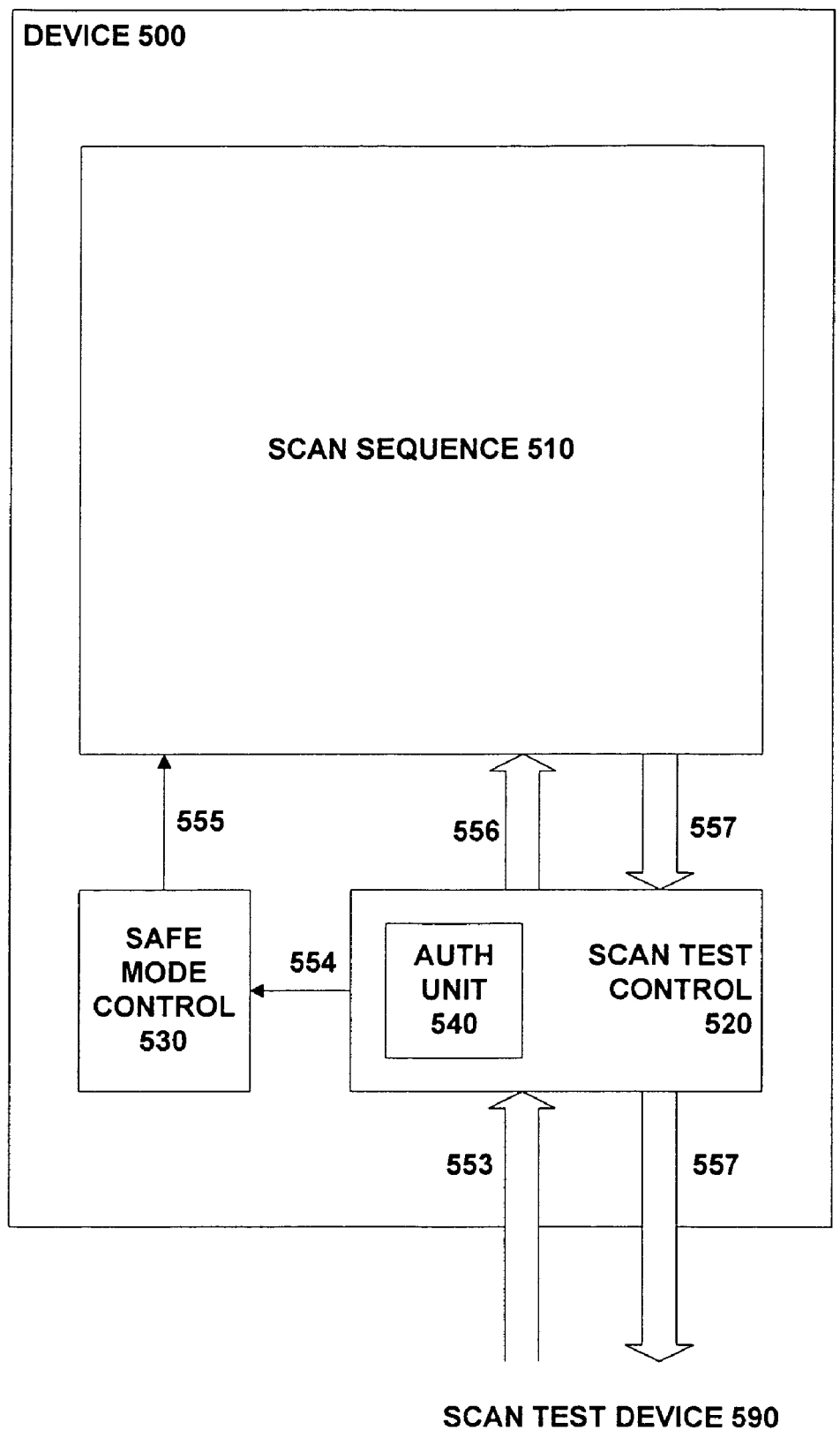
FIG. 5 illustrates a semiconductor device that supports scan testing in accordance with one embodiment of the present invention.

FIG. 5 depicts a semiconductor device 500 that supports scan testing in accordance with one embodiment of the invention. Thus device 500 includes a scan test control unit 520, which interacts with an external scan test device 590. This interaction is typically performed via appropriate input/output pins on device 500, such as by using a JTAG connection (as described in more detail below, with reference to FIG. 14).

Semiconductor device 500 also includes a scan sequence 510. This represents the set of functional components on the device that are joined together to form the sequence of flip-flops and so on that are to be tested in scan mode. Thus to perform such testing, the scan test control unit 520 receives an input scan vector 553 from external scan test device 590, along with appropriate control commands. This input scan vector is then forwarded to the scan sequence 510, as indicated by arrow 556. One or more processing steps are then performed within the scan sequence 510, as determined by the scan test control unit 520, following which the output scan vector 557 is read out from scan sequence 510 through scan test control unit 520 to the external scan test device 590. (It will be appreciated that this corresponds generally to the operations shown in FIGS. 3A–3D).

The scan test control unit 520 also includes an authorisation unit 540, which monitors the input scan vector received from the external scan test device 590, and checks it against one or more predetermined criteria. If these criteria are satisfied, the input scan vector is regarded as authorised, and scan testing can proceed as just described. On the other hand, if the input scan vector does not satisfy the criteria, then the authorisation unit regards the input scan vector as potentially unsafe. In other words, there is the possibility that the input scan vector may damage the semiconductor device 500.

Device 500 also includes a safe mode control unit 530. This generates an enable signal 555 (corresponding to the Enable signal illustrated in FIG. 4). In the normal course of events, once the input scan vector has been authorised by authorisation unit 540, the scan test control unit 520 sends a signal 554 to the safe mode control unit 530 indicating that the enable signal 555 can be asserted. Consequently, once the input scan vector 556 has been successfully installed into scan sequence 510, the enable signal 555 can be asserted to allow one or more normal processing steps to occur for the scan testing.

On the other hand, if the authorisation unit 540 detects that the input scan detector does not satisfy the authorisation criteria, then the lack of authorisation signal 554 to the safe mode control unit 530 prevents the enable signal 555 from being provided. The effect of this is that device 500 is kept in safe mode, thereby avoiding any potential damage, irrespective of the precise contents of the input scan vector 556. As a result, semiconductor device 500 is protected against the inadvertent input of an incorrect scan vector, which might otherwise damage the device. Likewise, semiconductor device 500 is also protected against any malicious attack, whether based on supplying a deliberately damaging input scan vector, or on trying to reverse engineer the device by experimenting to see how it responds to a wide range of (unauthorised) input scan vectors.

Figure 6:
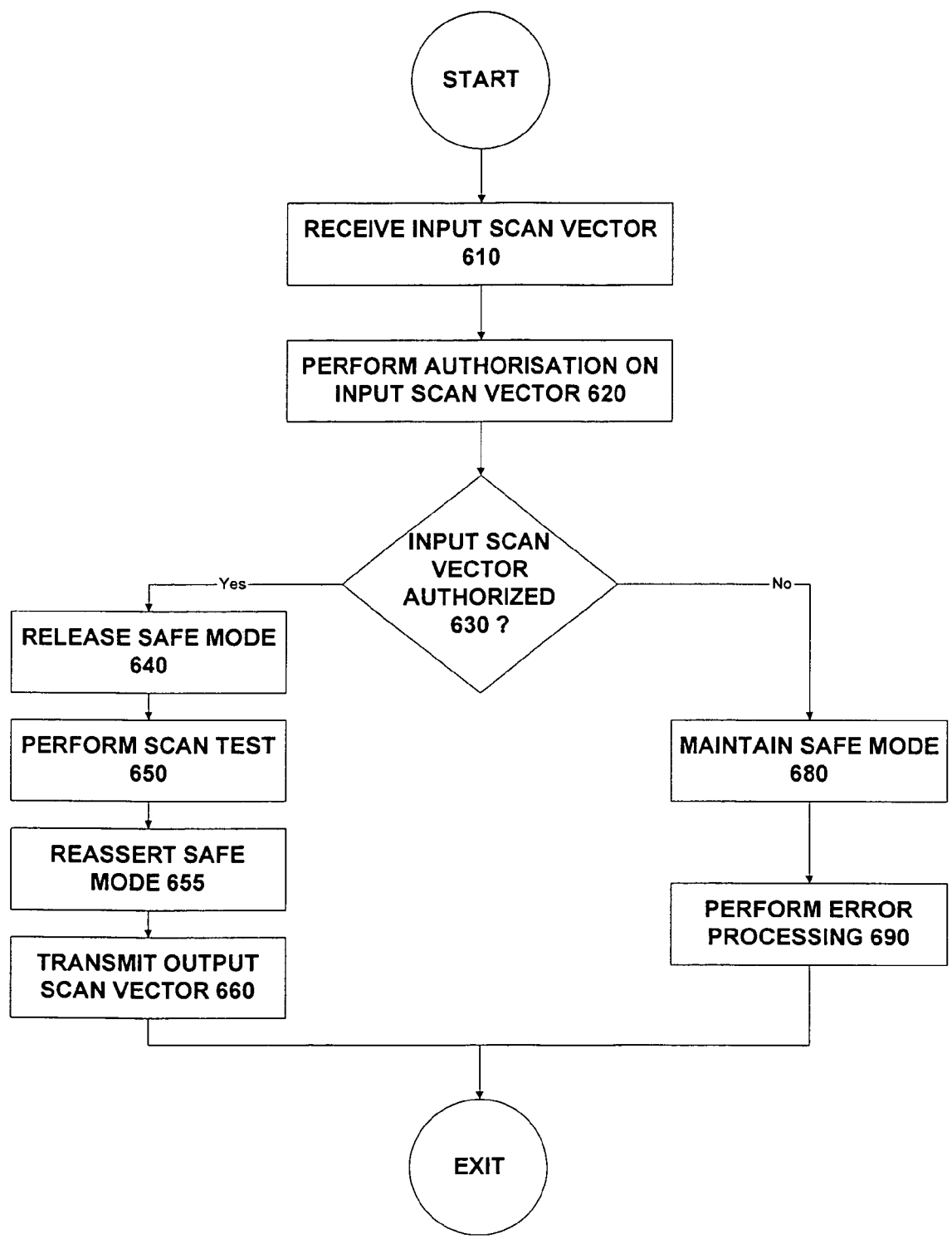
FIG. 6 provides a flowchart depicting a method for performing scan testing in accordance with one embodiment of the present invention.

The process for providing such protection is illustrated in the flow chart of FIG. 6 which starts with the device receiving an input scan vector (step 610). An authorisation check is then performed on this input scan vector (step 620) to determine whether or not it is properly authorised (step 630). If this is indeed the case, then the device is allowed to come out of safe mode (step 640) and a scan test can be performed (step 650). When this is completed, the system can now be returned to safe mode (step 655), and the output scan vector resulting from the scan test can be transmitted out from the device (step 660).

However, returning to step 630, if it turns out that the input scan vector is not authorised, then the device is maintained in safe mode (step 680). This can then be accompanied by appropriate error processing (step 690), such as providing an error signal to the external scan test device.

In one embodiment, a special indicator bit is inserted into the output scan vector 557. The value of this indicator bit is set according to whether or not the scan test was properly performed. Thus if the input scan vector is correctly authorised at step 630, then this bit is set to zero, for output with the output scan vector at step 660. In this way, the recipient of the output scan vector knows that the scan test has been performed correctly. On the other hand, if the test at step 630 is negative, the system still goes through the motion of performing the scan test (as per step 650), but without first releasing the device from safe mode. This will of course impact the value of the output scan vector 557 which is then produced (as per step 660), as can be understood by considering the behaviour of the circuitry described above in relation to FIG. 4. In this case, the indicator bit is therefore set to one, thereby alerting a recipient of the output scan vector that the input scan vector was not authorised.

Figure 7:
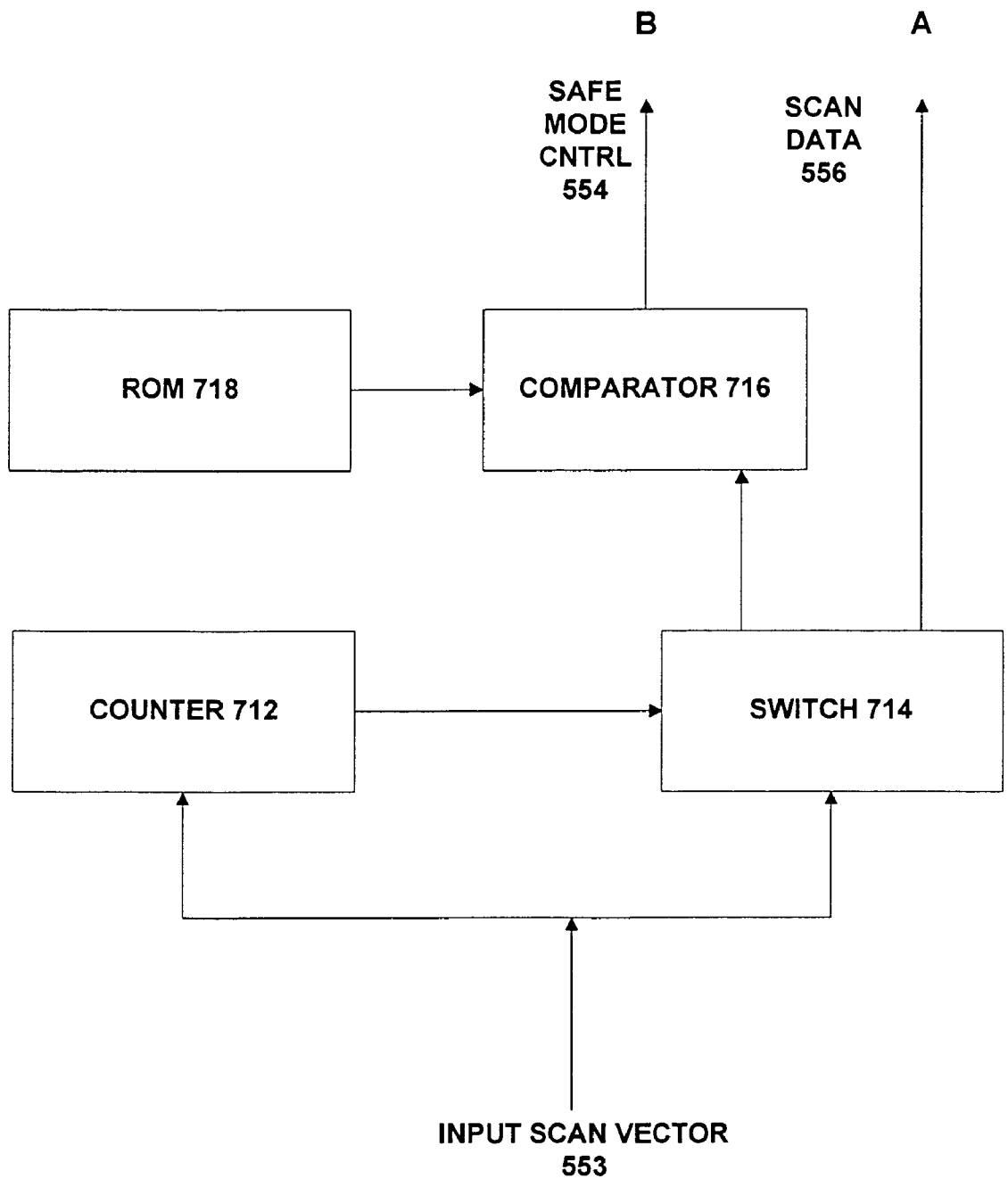
FIG. 7 depicts one possible implementation of an authorisation unit for the device of FIG. 5.

FIG. 7 depicts one possible implementation of authorisation unit 540 from FIG. 5. In this particular implementation it is assumed that a legitimate or authorised input scan vector will be preceded by a predetermined authorisation code. Authorisation unit 540 maintains a copy of this authorisation code in ROM 718. (The skilled person will appreciate that ROM 718 may be implemented if so desired in hard-wired logic).

An input scan vector is directed to switch 714 which in turn is controlled by counter 712, which also receives a copy of the input scan vector 553. The counter 712 controls the switch 714 such that the initial bits of the input scan vector are directed to comparator 716, while the remaining bits of the input scan vector are passed through as the input scan vector 556 to the scan sequence 510 (as indicated by arrow A in FIG. 7).

The authorisation code initially received by comparator 716 is compared against the authorisation code stored in ROM 718. This authorisation code may, for convenience, represent the mask ID used to fabricate the particular semiconductor device, although any other appropriate value for the authorisation code can be used. If comparator 716 detects a match between the authorisation code supplied from ROM 718, and that provided at the head of the input scan vector 553, then it is assumed that the input scan vector is properly authorised. In this situation the comparator 716 generates a signal 554 (indicated by arrow B in FIG. 7) that is sent to the safe mode control unit 530, in order to allow the device to come out of safe mode. On the other hand, if comparator 716 does not detect such a match, then it is assumed that the input scan vector is not authorised. In this situation no output authorisation signal is generated by comparator 716, and accordingly device 500 is maintained in safe mode. This therefore prevents any damage being caused to device 500 by an inappropriate input scan vector 553.

The embodiment of FIG. 7 provides a very simple and efficient mechanism for determining whether or not an input scan vector is properly authorised. However, it does have the limitation that the authorisation check is performed upon an authorisation code located at the beginning (or end) of the input scan vector, rather than upon the operational contents of the input scan vector itself. Thus it would in theory still be possible for the device to be damaged if a legitimate authorisation code somehow became associated with an unsuitable input scan vector. One way in which this might plausibly happen is if the input scan vector initially provided to the external scan test device were originally correct and so accompanied by a correct authorisation code, but that this input scan vector subsequently became corrupted, either within the external scan test device itself, or possibly when transmitted from the scan test device to the semiconductor chip to be tested.

Figure 8:
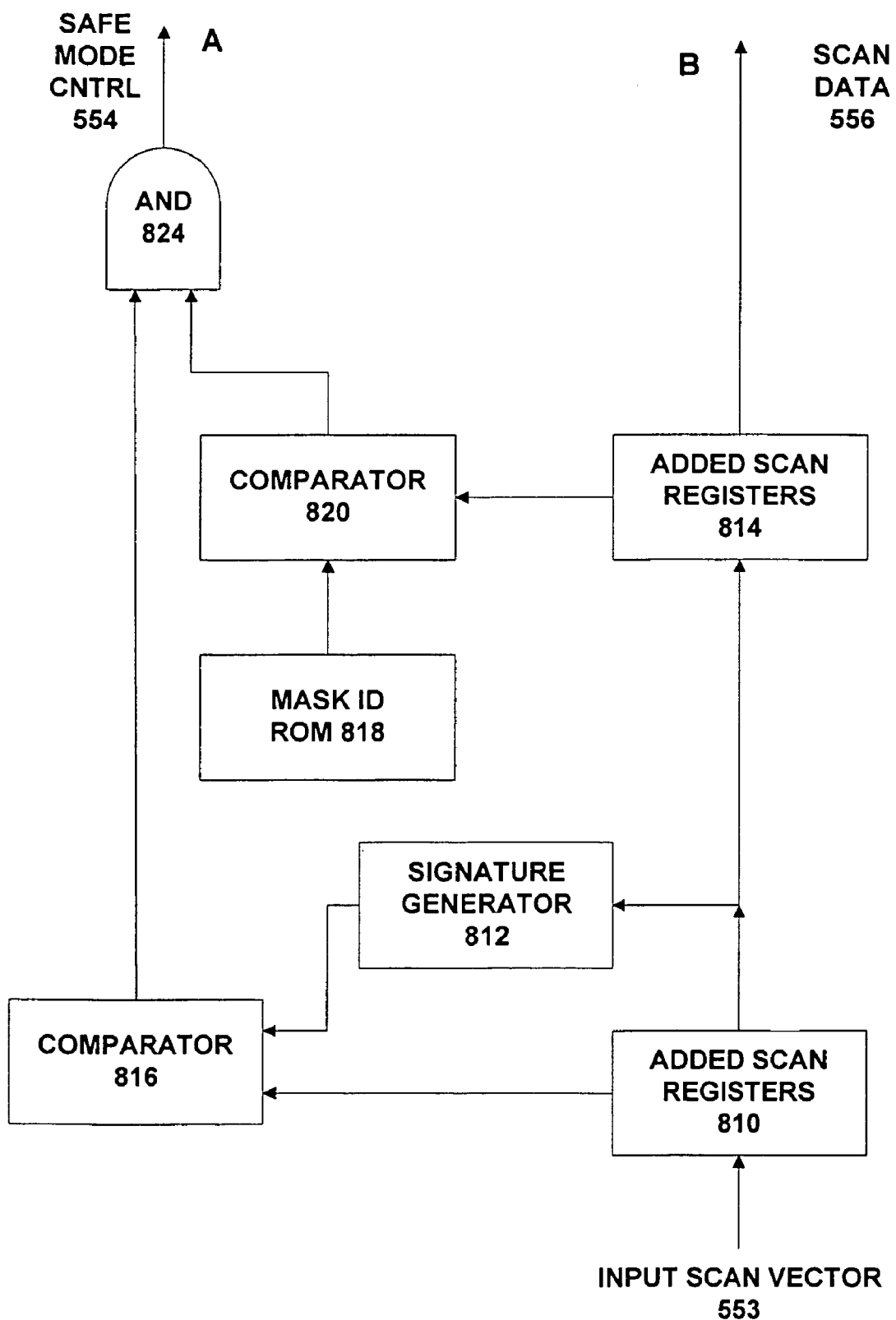
FIG. 8 depicts another possible implementation of an authorisation unit for the device of FIG. 5.

FIG. 8 illustrates an embodiment of an authorisation unit that overcomes this problem. This embodiment is to be used in conjunction with the input scan vector 553 shown schematically in FIG. 9.

Figure 9:
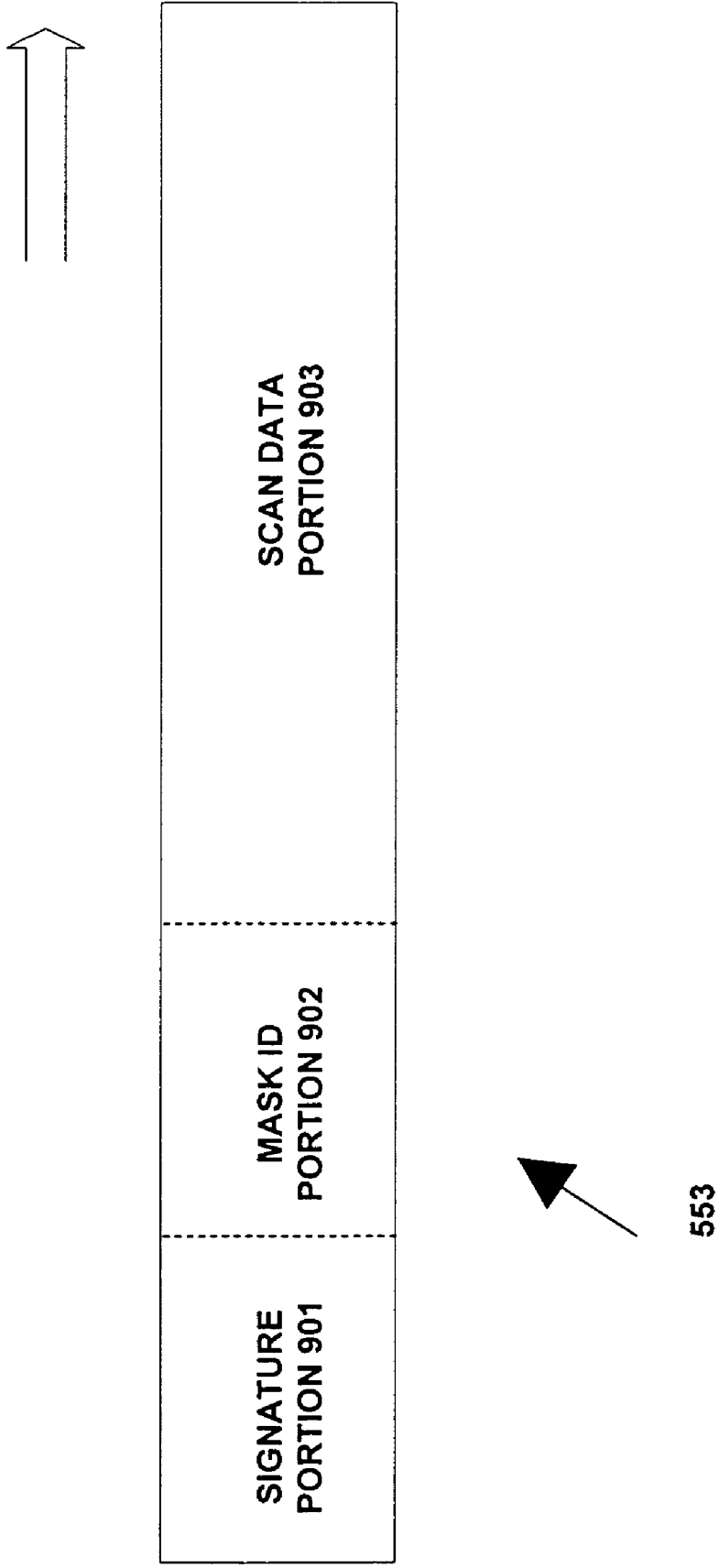
FIG. 9 is a schematic diagram representing a possible structure of an input scan vector for use with the authorisation unit of FIG. 8.

Thus looking at FIG. 9 first, the input scan vector 553 shown therein comprises three portions. The first of these (in order of insertion into a test device) comprises the scan data itself that is to be loaded into the various flip-flops of the scan sequence, as described above in relation to FIG. 3, and corresponding to arrow 556 in FIG. 5. This is shown in FIG. 9 as scan data portion 903. The second portion of scan vector 553 comprises the mask ID 902. This is the ID of the mask used to create the semiconductor device for which the scan vector 553 is intended to be used. Note that this is a sensitive discriminator between various device layouts. Thus there may be slight subtle variations between different generations of a given device, where the generations all share the same device number; however, these different generations should be reflected in correspondingly different mask IDs. The third and final portion of scan vector 553 comprises a signature portion 901. This will be discussed in more detail below.

When the scan vector 553 of FIG. 9 is loaded into the authorisation unit of FIG. 8, the scan data portion 903 passes through two sets of added scan registers 810 and 814, and, then as indicated by arrow B, into the scan sequence 510 proper (see FIG. 5). At this point the mask ID portion 902, which is immediately behind the scan data portion 903, is located in the added scan registers 814, while the third and final portion of the scan vector 553, namely the signature portion 901, is located in the added scan registers 810. Note that added scan registers 814 and 810 can be regarded as an extension of scan sequence 510 on its input side, except that they do not contain any (bypassed) combinational logic. It will also be appreciated that each of added scan registers 810 and 814 may be implemented as one or more individual registers, providing of course that they have the appropriate length to hold the signature portion 901 and the mask ID portion 902 respectively.

The authorisation unit of FIG. 8 also contains two comparators 820 and 816. The first of these compares the mask ID as stored into added scan register(s) 814 with a value for the mask ID that is stored on the device in a ROM 818. (It is standard to store the mask ID for a semiconductor device somewhere within the device for a variety of purposes, so that ROM 818 or a similar facility such as appropriate hard-wired logic is likely to be already present). The output of comparator 820 is then directed at AND gate 824 (the other input of which will be discussed below). When both inputs of AND gate 824 are positive, in other words, when both comparators 816 and 820 detect a match, then an enable signal 554, as indicated by arrow A, is passed to the safe mode control unit 530 (see FIG. 5). This in turn then allows the scan test proper to proceed.

The comparison of the mask ID for the device and the mask ID for the input scan vector within comparator 820 provides one form of confirmation that the scan vector is a suitable one for that device. However, from a logical point of view, this is analogous to the embodiment of FIG. 7, where the mask ID is used for the authorisation code. Thus the output of comparator 820 does not protect against corruption of the scan data portion 903 itself.

Instead, it is the task of the signature portion 901 of the scan vector 553 to provide such protection. Thus the scan data portion 903 and the mask ID portion 902 are both directed through a signature generator 812. This calculates a digital signature for these two portions, as will be discussed in more detail below, which is then made available to comparator 816 in order to confirm that the digital signature, as generated by unit 812, matches the signature portion 901 within the input scan vector. If this is indeed the case, then comparator 816 sends a positive output to AND gate 824, thereby allowing an enable signal 554 to be sent to the safe mode control unit 530, as previously described.

Signature generator 812 calculates a function of the input scan vector which is highly sensitive to any slight change in the input scan vector. Therefore, even a minor change in the input scan vector is detectable. In addition, the output of the signature generator 812 is much more concise and compact than the input scan vector (otherwise the authorisation testing might as well be performed directly on the scan vector itself).

Suitable mathematical functions for use in signature generator 812 are already widely employed, primarily in cryptography-based digital signature techniques. Such applications usually adopt a two-stage process, in which the first step is to calculate a hash or digest of an input message. One standard technique for calculating a digest is known as the Secure Hashing Algorithm (SHA). This is widely used in cryptography-based digital signature techniques, and is described in detail at: http://www.itl.nist.gov/fipspubs/fip180-1.htm. The SHA produces a 160-bit output representing a message digest from an input message of any length of up to $2^{64}$ bits. For the second step, this hash or digest is then encrypted using an asymmetric cryptographic algorithm and the private key of the message originator to provide an authenticating digital signature. (See http://www.abanet.org/scitech/ec/isc/dsgtutorial.html for a general discussion of digital signature techniques).

It is expected that many embodiments of the present invention will employ a full cryptographic digital signature within signature generator 812 (see below with regard to FIG. 12). However, in some implementations, by way of simplification, it may be decided to omit the second step of the above process, namely the encryption, and instead to use only the first step (calculation of a hash or digest). (For consistency, this will still be referred to herein as a digital signature of the input scan vector). Thus in one embodiment of FIG. 8, signature generator 812 calculates the SHA for an input scan vector. The resulting digest is then compared with a predetermined signature portion 901, as stored in added scan register(s) 810, using comparator 816, in order to determine whether or not to authorise the input scan vector. It will be appreciated that the SHA represents just one of many available techniques that can potentially be implemented in signature generator 812.

Figure 10:
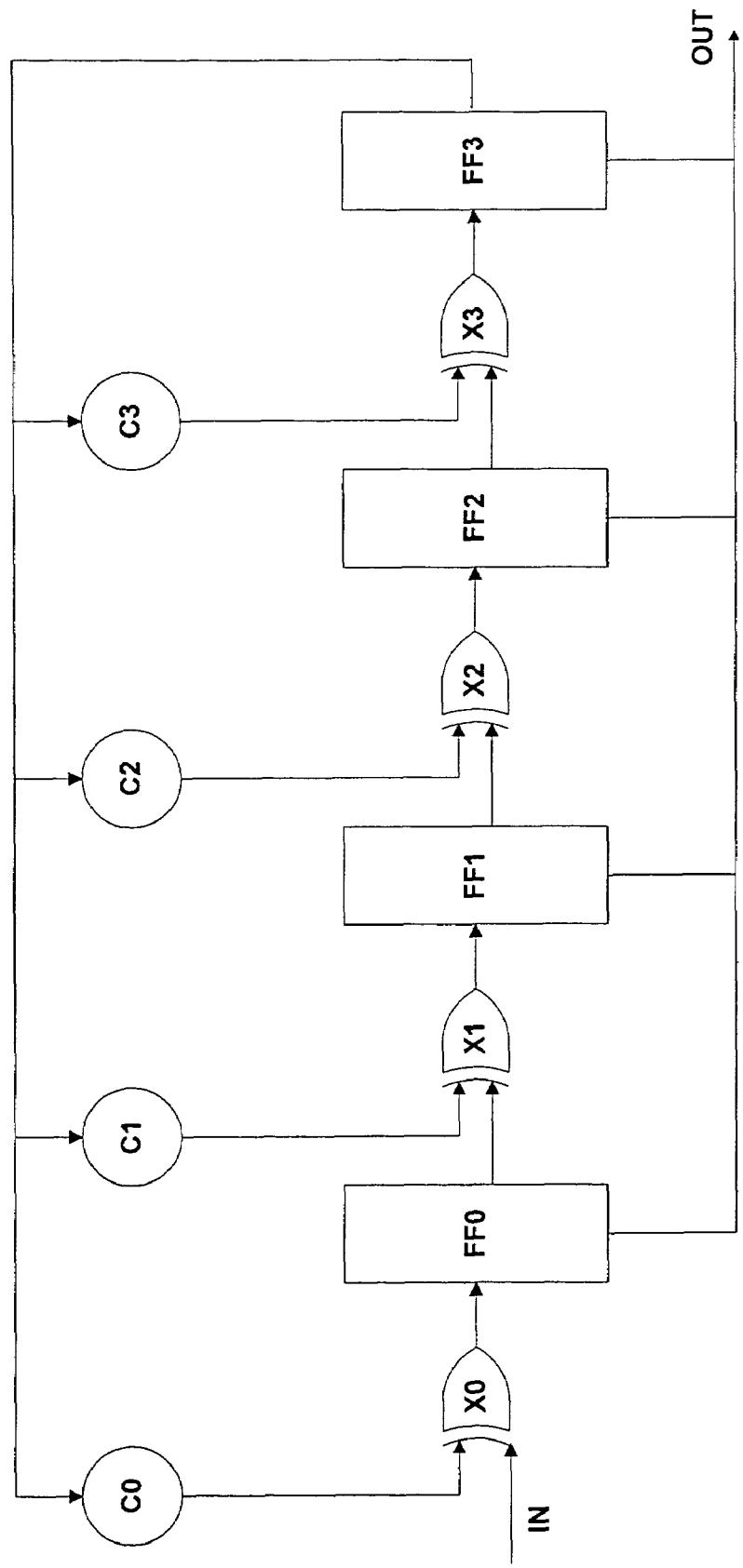
FIG. 10 is a generalised schematic diagram of a linear feedback shift register (LFSR), which can be used as a signature generator in the authorisation unit of FIG. 8.

FIG. 10 illustrates in generalised form a linear feedback shift register (LFSR), which can also be used as the basis of a very simple and effective implementation of signature generator 812. Thus each stage of the LFSR comprises a two-input XOR gate and a flip-flop (X0, FF0; X1, FF1; X2, FF2; and X3, FF3). An input to the LFSR is provided to one input of the XOR gate of the first stage (X0 in FIG. 10), while the output from the LFSR is taken in parallel from the outputs of the flip-flops of the various stages, as shown in FIG. 10.

For each stage, one input of the XOR gate is connected to the output of the flip-flop of the preceding stage. The other input of the XOR is potentially connected by a feedback loop to the output of the LFSR, dependent upon whether a corresponding connection (C0, C1, C2, and C3) is open or closed. (Note that if a connection is open, then the corresponding XOR gate can clearly be omitted as redundant). Any given LSFR can be represented by a polynomial, which specifies which particular connections are open or closed. For example, in FIG. 10, the polynomial $X^3+X^1+1$ would imply that C2 is open, and the remaining connections (C0, C1, and C3) are closed.

All the stages of the LSFR are clocked at the same time (for simplicity the clock signal is omitted from FIG. 10), which will cause the state of the LFSR, as determined by the contents of the flip-flops (FF0–FF3), to transition from one state to another, dependent upon the particular polynomial and the starting state of the LFSR. Certain polynomials are known to produce maximal length LFSRs, whereby, in the absence of input, an m-bit LSFR will cycle through $2^m-1$ different states before repeating itself (the one state omitted from the sequence is all zeros). Such LFSRs are frequently used for generating pseudo-random bit sequences, and are described for example at pages 655–657 in: "The Art of Electronics" by Horowitz and Hill, 1989, Cambridge University Press (ISBN 0-521-37095-7).

Figure 11:
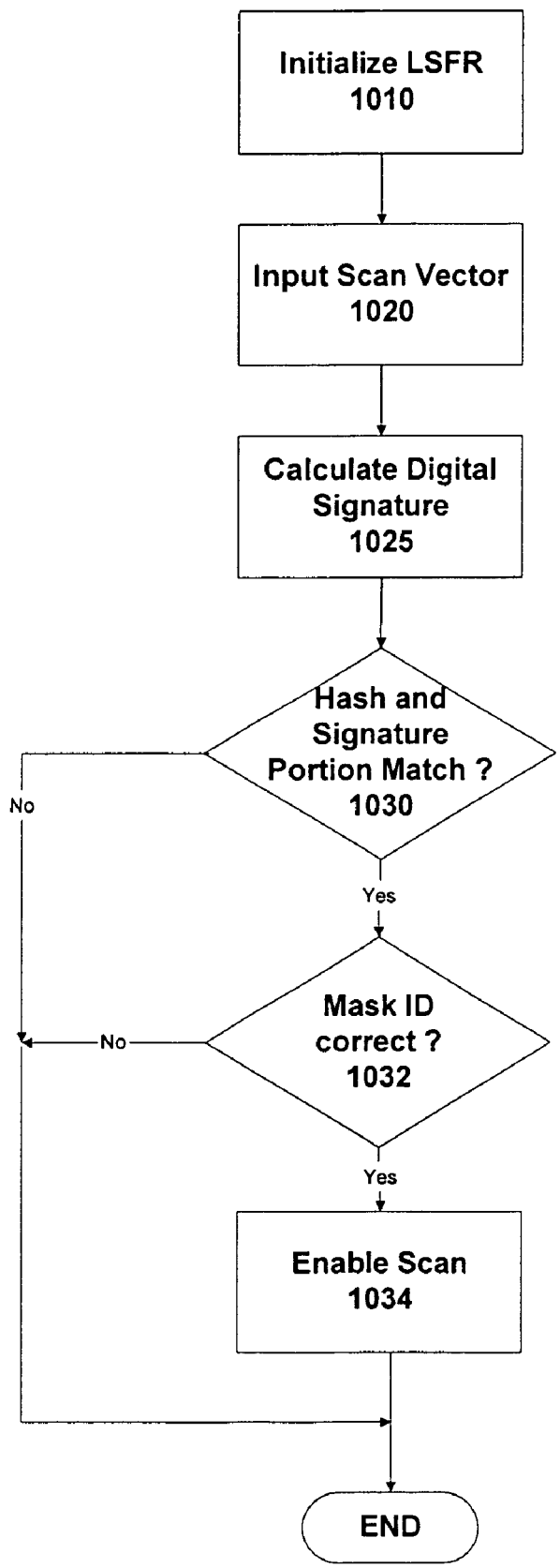
FIG. 11 is a flowchart of a method for performing the authorisation of an input scan vector using an LFSR in accordance with one embodiment of the invention.

FIG. 11 provides a flowchart representing the use of an LFSR as a signature generator 812, in the authorisation unit of FIG. 8. The method commences with the initialisation of the LSFR to an appropriate value (step 1010) (typically via some mechanism not shown in FIG. 8). One possibility is that the LFSR is set to 0, or it may be set to some other predetermined initial value, such as potentially the mask ID stored in ROM 818, for example.

The input scan vector 553 is input into the device (step 1020). This leaves the scan data portion 903 of the input scan vector loaded into the scan sequence 500, the mask ID portion 902 loaded into the added scan register(s) 814, and the signature portion 901 loaded into the added scan register(s) 810. At the same time, the scan data and mask ID portions 902, 903 of the input scan vector 553 are passed sequentially through the LFSR signature generator, which therefore calculates a signature of these two portions (step 1025).

It is then verified that the mask ID, as stored in the added scan register(s) 814, matches the value stored on the chip (step 1030). It is also verified that the signature calculated at step 1025 and stored in the LFSR matches the value stored in the added scan register(s) 810 (step 1032). Assuming that both of these two comparisons are successful, then the input scan vector 553 is regarded as legitimate, and the system enables the scan to proceed (step 1034). Otherwise, scan testing with the input scan vector is not enabled.

It will be appreciated that the signature confirms that the entire scan vector (as fed to the scan sequence 510) is correct. Thus even a small change or corruption (whether accidental or deliberate) of the scan data portion 903 will lead to a different signature being calculated by the signature generator 812, and hence rejection of the scan vector as inconsistent with the signature portion 901. Note that the mask ID portion 902 is also included in the calculation of the signature portion 901, and so this too is verified by the signature in order to confirm that the scan vector is indeed intended for this particular device.

Although the LFSR of FIG. 9 comprises four stages, which would lead to a 4-bit signature value, a practical implementation of signature generator 812 will generally produce a rather longer signature value (for example, by having more stages in the LFSR). Thus if the signature value is m-bits in length, then for a good hashing function, the probability that an arbitrary scan vector will have a given signature value is $1/(2^m-1)$. This then corresponds to the chance probability of a false-positive, where the authorisation unit 540 erroneously authorises an incorrect scan vector. By increasing the length, m, of the signature value therefore, this probability can be reduced to an acceptably small value. In general, it will be appreciated that a shorter length for signature portion 901 might be used for engineering simplicity and/or cost reasons, while a greater length would give increased security. A typical signature portion might perhaps have from 32 to 256 bits for present day technology, depending on the particular semiconductor device concerned, but other values could also be used, depending on the particular circumstances.

While FIGS. 8–10 illustrate one possible implementation for the authorisation unit 540 incorporating an LFSR, there are many alternative possible strategies for using an LFSR (or other form of device) as the signature generator 812. For example, in another embodiment, the final portion of the input scan vector (corresponding to the signature portion 901 of FIG. 9) is selected such that a correct input scan vector leaves the LFSR in some special state, for example, all zeros, or set to the mask ID (as stored in ROM 818). It can then be tested that the LFSR is indeed in this special state before accepting the input scan vector 553 as legitimate. This obviates the need for added scan register(s) 810. However, depending on the particular function used for signature generation, it can be non-trivial from a mathematical perspective to determine the necessary final portion of the input scan vector for a given scan data portion and mask ID portion.

A further consideration arises from the desire to protect the chip against malicious attack, rather than simple accidental corruption of an input scan vector. This implies that it must be as difficult as possible for an adversary to in effect legitimise an inappropriate scan vector by appending the correct digital signature for the (inappropriate) scan vector.

One way of doing this is rather than comparing the calculated signature with the final portion of the scan vector, the comparison could be made with one or more predetermined signature values already stored on the device. The limitation of this strategy however, is that the relevant input scan vectors to be used for testing must be known in advance, at fabrication of the device. Unfortunately, in practice this is rarely the case, not least because the testing frequently has to address fault conditions which, by their very nature, were not originally anticipated. Nevertheless, this is a highly secure technique, in that it restricts testing of the device to input scan vectors that have already been authorised at manufacture.

Figure 12:
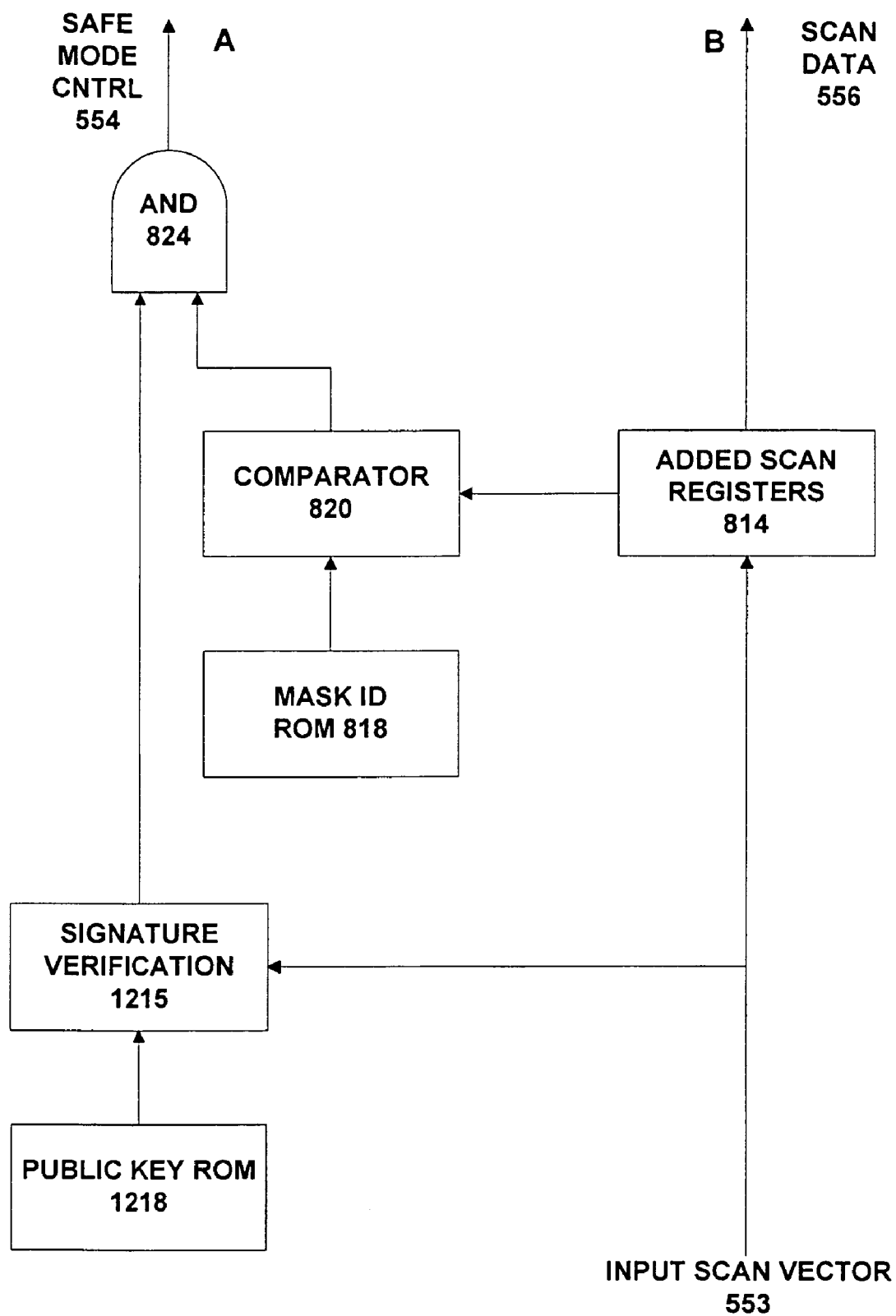
FIG. 12 depicts another possible implementation of an authorisation unit for the device of FIG. 5.

Another approach that does allow new authorised input scan vectors to be developed after manufacture but without compromising security is illustrated in the embodiment of FIG. 12. This again uses the input scan vector structure shown in FIG. 9, but in this case, the signature portion 901 represents a full digital signature (as discussed above) of the scan data portion 903 and mask ID portion 902. Thus this signature portion 901 is generated by first calculating a hash or digest of the mask ID and scan data portions, and then encrypting this using an asymmetric encryption algorithm. The private key employed in this encryption step is known only to the manufacturer of device 500 (and any other properly authorised party).

An input scan vector 553 having such a structure can be supplied to the authorisation unit shown in FIG. 12. (Note that in this embodiment, the mask ID ROM 818, comparator ROM 820, AND gate 824, and added scan register(s) 814 operate as already described in relation to the embodiment of FIG. 8, and so will not be described further). In particular, the input scan vector is passed to the signature verification unit 1215, which performs two tasks. The first is to calculate the digest of the scan data portion 903 and mask ID portion 902, using the same hashing technique as originally employed for generating the signature portion 901. The second is to use the public key stored in public key ROM 1218 in order to decrypt the received signature portion 901. This public key is the counterpart of the private key of the manufacturer of the device 500.

The results of these two operations are compared, and should be the same for a legitimate scan vector (i.e. with a correct scan data portion 903 and mask ID portion 902). In this case, the signature verification unit 1215 sends an enable signal to AND gate 824, thereby authorising the device to come out of safe mode. However, no such signal is sent if the signature verification unit does not detect a match.

This approach protects the device 500 against an inappropriate scan vector. Thus if the scan data portion 903 and/or the mask id portion 902 is altered (whether accidentally or deliberately) from its original value, then the hash calculated by the signature verification unit 1215 will not match that encrypted in the signature portion 901, and accordingly the scan vector will be rejected. Likewise, without knowledge of the private key, it is not possible for an adversary to determine the correct signature portion to legitimise their own (potentially damaging) scan vectors. The use of the digital signature therefore ensures not only that an input scan vector comes from the properly authorised source, such as the manufacturer, but also that it has not since been altered or corrupted in any way.

It will be appreciated that although the public key 1218 does not need to be kept secret per se for the algorithm to be secure, it must nevertheless be protected against modification. This can be ensured by appropriate selection of the type of ROM or other storage facility used to hold the public key, and also by locating the storage facility in a physically inaccessible part of the device (e.g. on the underside of the chip after mounting).

A further possible variation is that in some embodiments, a device ID portion could be included in the input scan vector, instead of (or potentially as well as) the mask ID portion 902. The device ID is unique to any particular chip, and is blown in at production time. In this situation, the authorisation process for an input scan vector therefore verifies the vector includes a device ID portion that matches the device ID stored on the chip, in the same way as described above in relation to the mask ID. It will be appreciated that, if desired, the embodiments of both FIGS. 8 and 12 could be modified in this manner to support device ID testing.

With this approach, a given input scan vector is now only suitable for a single chip. Therefore, even if a destructive input scan vector were to be produced with some malicious intent, this would only be effective against a solitary device, rather than against all chips having a given mask ID. On the other hand, of course, it is now more complicated for service engineers and other legitimate users, in that they must obtain a different input scan vector for each particular device that needs to be tested. Whether this trade-off between security and convenience is attractive will depend on the particular circumstances of the device (for example, whether it is intended for a military environment as opposed to a general commercial setting).

Figure 13:
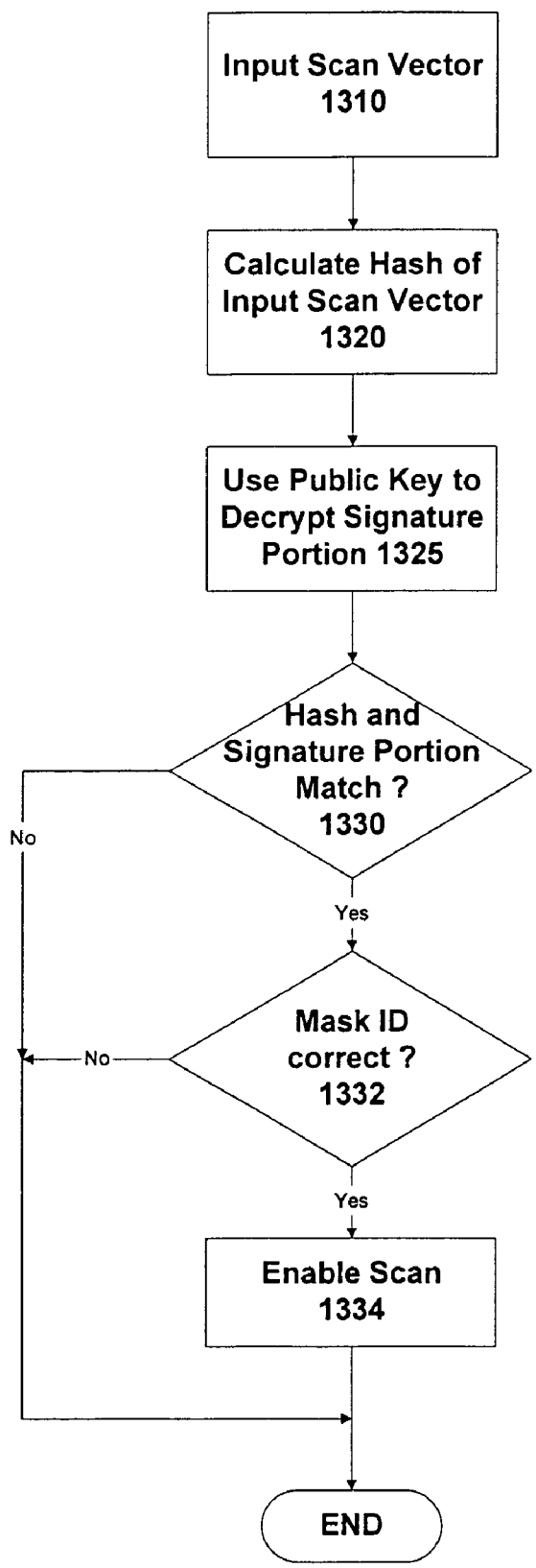
FIG. 13 is a flowchart of a method for performing the authorisation of an input scan vector in accordance with one embodiment of the invention.

FIG. 13 is a flowchart illustrating the signature verification process for use with the embodiment of FIG. 12. As before, the method starts with the input of a scan vector (step 1310). Next, a hash value for this scan vector (in particular the scan data portion 903 and mask id portion 902) is calculated (step 1320), and the relevant public key, as stored in public key ROM 1218, is used to decrypt the signature portion 901 of the input scan vector (step 1325). The two values produced in this manner can now be compared (step 1330) to verify the correctness of the digital signature. In addition, it is also verified by the comparator 820 that the mask ID portion 902 of the input scan vector matches the mask ID for the device, as stored in mask ID ROM 818 (step 1332). Assuming that both of these verifications are successful, the scan is enabled (step 1334). Otherwise, the input scan vector will be regarded as unauthorised, and so the device will be maintained in safe mode in order to avoid the risk of any damage. (This can also involve suitable error processing, such as discussed in relation to FIG. 6).

In the embodiments described so far, the authorisation unit 540 uses a safe mode control facility 530 to protect a device from damage if an unauthorised input scan vector is used. Such a safe mode control facility is typically already provided on many semiconductor devices for testing purposes, and so on. However, authorisation unit 540 could still operate to protect the device from unauthorised input scan vectors even in the absence of such a control facility. In this approach, the two successive enable signals 554 and 555 from FIG. 5 may, in effect, be combined into one single enable signal. For example, if the authorisation unit detects an incorrect input scan vector, it may be configured to keep the device in scan mode, and simply pass the input scan vector all the way through the device without making it operational to perform any processing steps. (It will be appreciated that this, in itself, can be regarded as a form of safe mode).

In one embodiment, the device 500 is provided with a pin that is used to subvert the authorisation process described above. For example, one possibility is for the signal from this pin to be combined using an OR gate with the signal represented by arrow A in FIG. 8. Alternatively, the pin may be used to a set a bit in a register that in turn is used to indicate whether or not the authorisation process is to be utlised.

Such a facility is primarily intended to permit testing at fabrication and assembly time to be performed without the overhead of the authorisation process (i.e. without having to utilise the mask ID portion 902 and signature portion 901 of the input scan vector 553 of FIG. 9). This is appropriate, in that such testing is performed within a highly controlled environment. Note that the subversion pin is arranged to have a location that is inaccessible after assembly (such as by being underneath a mounted device). Consequently, it is not possible to bypass the authorisation process after assembly without having to remove a soldered component from its mounting on a circuit board.

Figure 14:
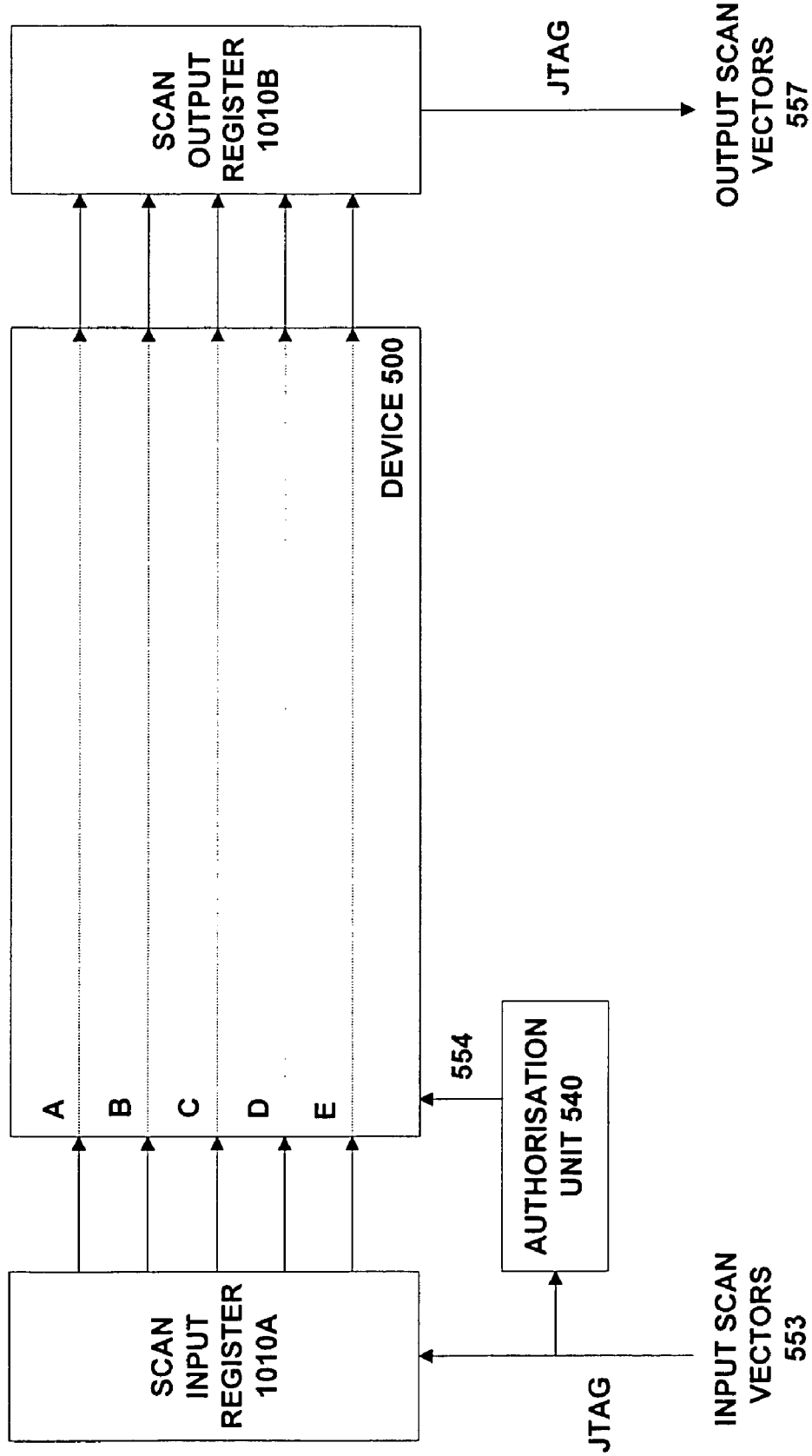
FIG. 14 depicts the use of a JTAG connection for performing the input of multiple scan vectors in parallel.

FIG. 14 illustrates another embodiment of the invention, in which a device 500 is subjected to multiple scan tests in parallel. This is accomplished by providing a scan input register 1010A and a scan output register section 101B, which in turn are both linked to a JTAG test chain. (JTAG is a well-known standard for board testing, known formally as the IEEE 1149.1 Standard Test Access Port and Boundary Scan, and is described, for example, in the white paper "Introduction to JTAG Boundary Scan" available at http://www.sun.com/microelectronics/whitepapers/wpr0018-01).

The device 500 incorporates five independent scan sequences (each corresponding to a single scan sequence 510, such as shown in FIG. 5), although it will be appreciated of course that the number of such scan sequences may vary from one embodiment to another. In FIG. 12, the five different scan sequences are labelled A, B, C, D, and E. The use of such multiple chains in parallel reduces the time needed for a given scan test to be performed (compared to having one very long scan sequence), and also can make it easier to avoid overly long connections between components of the same scan sequence. The input scan vector used in this embodiment typically has the configuration shown in FIG. 9, except that the scan data portion 903 now comprises the five multiplexed scan sequences (there is still only a single mask portion and a single signature portion, which are shared across all of the five scan sequences).

The input scan vector is passed over a serial data input via the JTAG connection to input scan register 0110A. Thus the five input scan vectors, corresponding to scan sequences A, B, C, D, and E, are all multiplexed in a single path into register 1010A. A serial to parallel conversion is then performed, as the separate input scan vectors are demultiplexed, and fed to their corresponding scan sequence. After the scan tests have been performed (in parallel) for sequences A, B, C, D, and E, the opposite procedure occurs, in that a parallel to serial conversion is now performed on the five output scan vectors. Thus these are multiplexed together to form a single overall output scan vector in output scan register 101B. This is then fed out from the JTAG bus 1010B for further analysis.

Device 500 includes an authorisation unit 540, generally analogous to authorisation unit 540 of FIG. 5. This is used to verify the input scan vector, in the same manner as previously described, by confirming the correctness of the mask ID portion and the signature portion. In these circumstances, the output indicator bit may be set in all five output scan vectors to denote whether or not the device was maintained in safe mode throughout, or alternatively there may be only a single indicator bit in some shared output header. (Note that although such an indicator bit (or bits) is conveniently included in the relevant output scan vector 557, it can be provided instead, or additionally, via some status setting on output scan register 1010B, or via any other mechanism suitably accessible to external test equipment.

In conclusion, a variety of particular embodiments have been described in detail herein, but it will be appreciated that this is by way of exemplification only. The skilled person will be aware of many further potential modifications and adaptations that fall within the scope of the claimed invention and its equivalents.

The invention claimed is:

1. A semiconductor device including:
a port for receiving an input scan vector for scan testing;
an authorisation unit connected to said port, wherein if the input scan vector does not satisfy at least one predetermined criterion, said authorisation unit maintains the device in a safe mode in which scan testing with the input scan vector is at least partially disabled.

2. The device of claim 1, wherein said authorization unit maintains the device in safe mode if the input scan vector does not incorporate an input authorization code that matches a predetermined authorization code.

3. The device of claim 2, wherein said authorisation unit further includes a ROM storing said predetermined authorisation code.

4. The device of claim 1, wherein said authorisation unit sets a flag in an output scan vector according to whether or not the device has been maintained in safe mode.

5. The device of claim 1, wherein the input scan vector includes a signature portion, and said authorisation unit further includes a signature verification unit for assessing, on the basis of said signature portion, whether or not the input scan vector satisfies said at least one predetermined criterion.

6. The device of claim 5, wherein said signature verification unit comprises a signature generator for calculating an input signature value from the input scan vector, and a comparator for checking the input signature value against said signature portion, and wherein said authorisation unit maintains the device in safe mode if the comparator does not find a match.

7. The device of claim 6, wherein said signature verification unit further includes a decryption facility incorporating a stored public key for decrypting the signature portion prior to performing said checking against the input signature value.

8. The device of claim 5, further including a stored mask identifier, and wherein said authorisation unit maintains the device in safe mode if said stored mask identifier does not match a mask identifier included in the input scan vector.

9. The device of claim 8, wherein the signature portion in the input scan vector is dependent upon the mask identifier.

10. The device of claim 5, further including a stored device identifier, and wherein said authorisation unit maintains the device in safe mode if said stored device identifier does not match a device identifier included in the input scan vector.

11. The device of claim 10, wherein the signature portion in the input scan vector is dependent upon the device identifier.

12. The device of claim 6, wherein said signature generator comprises a linear feedback shift register.

13. The device of claim 7, wherein said signature generator comprises a hashing unit.

14. The device of claim 1, wherein the device is maintained in safe mode by not supplying an enable signal to at least one component vulnerable to potential damage during scan testing.

15. The device of claim 1, wherein said port is compatible with the JTAG standard.

16. The device of claim 1, further comprising a pin that can be used to allow the device to go out of safe mode irrespective of whether or not the input scan vector satisfies said at least one predetermined criterion.

17. A system amenable to scan testing by an input scan vector, and incorporating:
- an authorisation unit for determining whether or not an input scan vector satisfies at least one predetermined criterion; and
- a mechanism for at least partially disabling scan testing with the input scan vector if said at least one predetermined criterion is not satisfied.

18. A semiconductor device including:
- at least one operational means which is vulnerable to potential damage during scan testing with a given input data configuration;
- means for maintaining said semiconductor device in a safe mode in which said device is protected against said given input data configuration;
- means for receiving an input scan vector for scan testing; and
- means for providing an authorisation signal to said maintaining means, provided that the input scan vector satisfies at least one predetermined criterion.

19. A semiconductor scan test unit comprising:
- a port for establishing at least one electrical connection with a semiconductor device under test; and
- a stored input scan vector for supply to the semiconductor device under test via said at least one electrical connection;
- wherein said input scan vector comprises a first portion for setting the semiconductor device to a predetermined logical state, and a second portion for providing an authorisation to the semiconductor device.

20. The semiconductor scan test unit of claim 19, wherein the second portion comprises a digital signature of the first portion.

21. The semiconductor scan test unit of claim 19, wherein the input scan vector further comprises a third portion corresponding to a mask identifier for the device.

22. A method of scan testing a semiconductor device, said method comprising the steps of:
- providing an input scan vector to said semiconductor device;
- determining whether or not the input scan vector satisfies at least one predetermined criterion; and
- maintaining the device in a safe mode if the input scan vector does not satisfy said at least one predetermined criterion, wherein scan testing with the input scan vector is at least partially disabled in said safe mode.

23. The method of claim 22, wherein the device is maintained in safe mode if the input scan vector does not incorporate an input authorisation code that matches a predetermined authorisation code.

24. The method of claim 22, further comprising the step of storing said predetermined authorisation code in a ROM in said device.

25. The method of claim 22, wherein the input scan vector includes a signature portion, and the method further comprises the step of assessing, on the basis of said signature portion, whether or not the input scan vector satisfies said at least one predetermined criterion.

26. The method of claim 25, wherein said step of assessing comprises calculating an input signature value from the input scan vector, and checking the input signature value against said signature portion, wherein the device is maintained in safe mode if these do not match.

27. The method of claim 26, further comprising the step of storing a public key on the device, and wherein said step of assessing further comprises the step of decrypting said signature portion using said public key prior to performing said checking.

28. The method of claim 25, further comprising the steps of storing a mask identifier on the device, and comparing the stored mask identifier against a mask identifier included in the input scan vector, wherein the device is maintain in safe mode if these do not match.

29. The method of claim 28, wherein said signature portion is dependent on the mask identifier.

30. The method of claim 25, further comprising the steps of storing a device identifier on the device, and comparing the stored device identifier against a device identifier included in the input scan vector, wherein the device is maintain in safe mode if these do not match.

31. The method of claim 30, wherein the signature portion in the input scan vector is dependent upon said device identifier.

32. The method of claim 22, wherein the device is maintained in safe mode by not supplying an enable signal to at least one component vulnerable to potential damage during scan testing.

33. The method of claim 22, further comprising the steps of:
- generating an output scan vector as a result of a scan test; and
- inserting a flag into the output scan vector to indicate whether or not the device was maintained in safe mode during the scan test.

* * * * *